US010878866B2

(12) United States Patent
Baek

(10) Patent No.: US 10,878,866 B2
(45) Date of Patent: Dec. 29, 2020

(54) SEMICONDUCTOR STORAGE DEVICE

(71) Applicants: Kabushiki Kaisha Toshiba, Tokyo (JP); Toshiba Electronic Devices & Storage Corporation, Tokyo (JP)

(72) Inventor: Guseul Baek, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/561,850

(22) Filed: Sep. 5, 2019

(65) Prior Publication Data
US 2020/0294564 A1 Sep. 17, 2020

(30) Foreign Application Priority Data

Mar. 14, 2019 (JP) .................................. 2019-047687
Sep. 2, 2019 (JP) .................................. 2019-159816

(51) Int. Cl.
G11C 7/22 (2006.01)
G11C 7/08 (2006.01)
G11C 11/419 (2006.01)
G11C 11/418 (2006.01)

(52) U.S. Cl.
CPC ............... G11C 7/227 (2013.01); G11C 7/08 (2013.01); G11C 7/222 (2013.01); G11C 11/418 (2013.01); G11C 11/419 (2013.01)

(58) Field of Classification Search
CPC ......... G11C 7/04; G11C 7/08; G11C 11/4076; G11C 11/4091; G11C 11/4094; G11C 11/4097; G11C 2207/002; G11C 2207/005; G11C 7/065; G11C 7/12; G11C 7/18; G11C 11/419; G11C 11/22; G11C 11/5657; G11C 16/08; G11C 8/14; G11C 16/0483; G11C 7/14; G11C 11/1675; G11C 11/405; G11C 11/412; G11C 11/5607; G11C 11/5628; G11C 15/02; G11C 15/046; G11C 16/26; G11C 2211/4016
USPC .............. 365/203, 205, 206, 63, 194, 210.1, 365/189.09, 226, 207, 233.1, 185.11, 190, 365/227, 229, 145, 154
See application file for complete search history.

(56) References Cited

U.S. PATENT DOCUMENTS 8,223,581 B2 7/2012 Kawasumi
2008/0101143 A1* 5/2008 Jung .................... G11C 8/08
365/210.1

FOREIGN PATENT DOCUMENTS

JP 2010-152974 A 7/2010
JP 2013-143164 A 7/2013
JP 2013-206529 A 10/2013

* cited by examiner

Primary Examiner — Thong Q Le
(74) Attorney, Agent, or Firm — White & Case LLP

(57) ABSTRACT

According to one embodiment, there is provided a semiconductor storage device including a bit cell, a dummy cell, a word line, a dummy word line, a word line driver, a dummy word line driver, a first modulation circuit, and a second modulation circuit. The word line is electrically connected to the bit cell. The dummy word line is electrically connected to the dummy cell. The word line driver is electrically connected to the word line. The dummy word line driver is electrically connected to the dummy word line. The first modulation circuit is electrically connected to the word line driver. The second modulation circuit is electrically connected to the dummy word line driver.

18 Claims, 10 Drawing Sheets

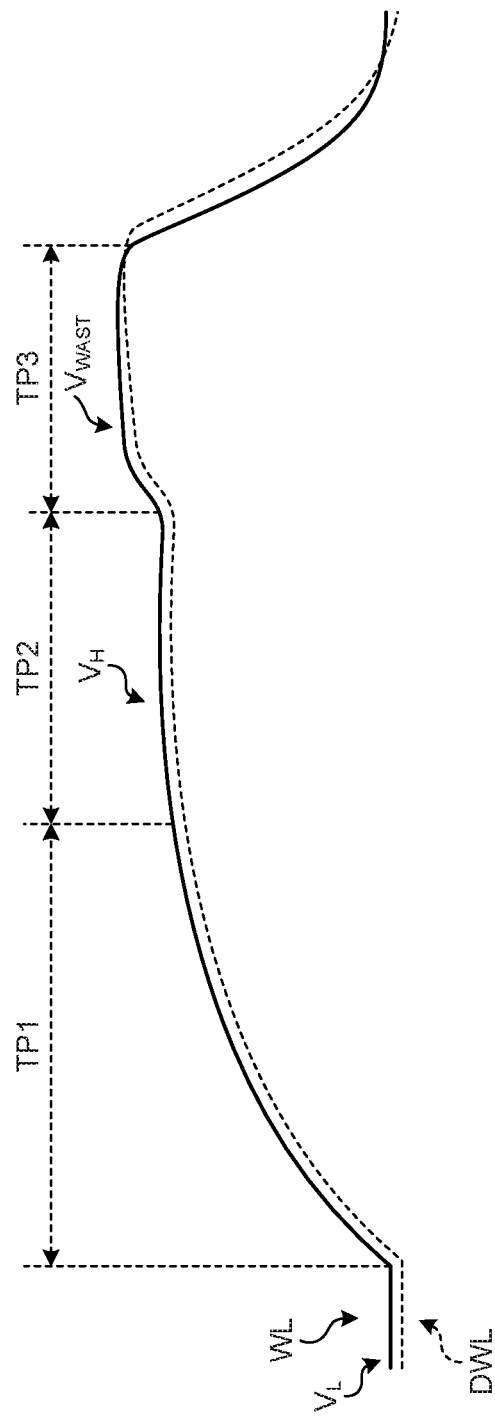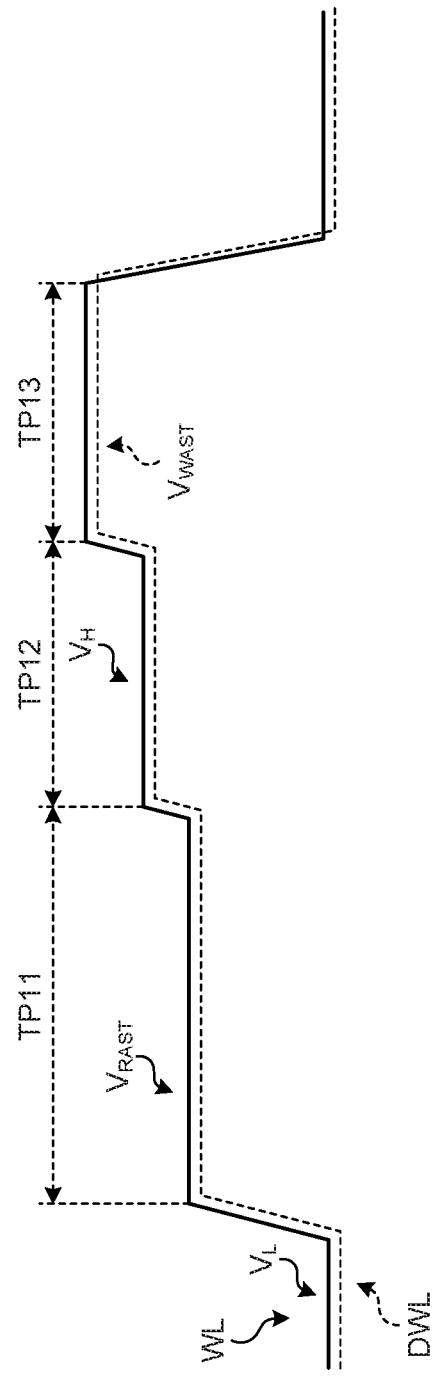

SEMICONDUCTOR STORAGE DEVICE

CROSS-REFERENCE TO RELATED APPLICATIONS

This application is based upon and claims the benefit of priority from Japanese Patent Application No. 2019-047687, filed on Mar. 14, 2019; and Japanese Patent Application No. 2019-159816, filed on Sep. 2, 2019; the entire contents of which are incorporated herein by reference.

FIELD

Embodiments described herein relate generally to a semiconductor storage device.

BACKGROUND

In a semiconductor storage device such as a static random access memory (SRAM), there is a case where timing of a sensing operation with respect to a bit cell is controlled by utilization of a cell current of a dummy cell in a read operation. Here, it is desired to appropriately control timing of the sensing operation with respect to the bit cell.

BRIEF DESCRIPTION OF THE DRAWINGS

FIG. 10A and FIG. 10B are waveform diagrams illustrating an operation of a semiconductor storage device according to a third modification example of the embodiment.

DETAILED DESCRIPTION

In general, according to one embodiment, there is provided a semiconductor storage device including a bit cell, a dummy cell, a word line, a dummy word line, a word line driver, a dummy word line driver, a first modulation circuit, and a second modulation circuit. The word line is electrically connected to the bit cell. The dummy word line is electrically connected to the dummy cell. The word line driver is electrically connected to the word line. The dummy word line driver is electrically connected to the dummy word line. The first modulation circuit is electrically connected to the word line driver. The second modulation circuit is electrically connected to the dummy word line driver.

Exemplary embodiments of a semiconductor storage device will be explained below in detail with reference to the accompanying drawings. The present invention is not limited to the following embodiments.

Embodiment

A semiconductor storage device according to the embodiment is, for example, a static random access memory (SRAM) and has a plurality of bit cells. Since electric power is continuously supplied to each of the plurality of bit cells in order to hold data, power consumption reduction and a low voltage operation may be demanded thereto. When a voltage of power potential to each bit cell becomes low, there is a case where data is destroyed when the data is read from each bit cell.

Figure 1:
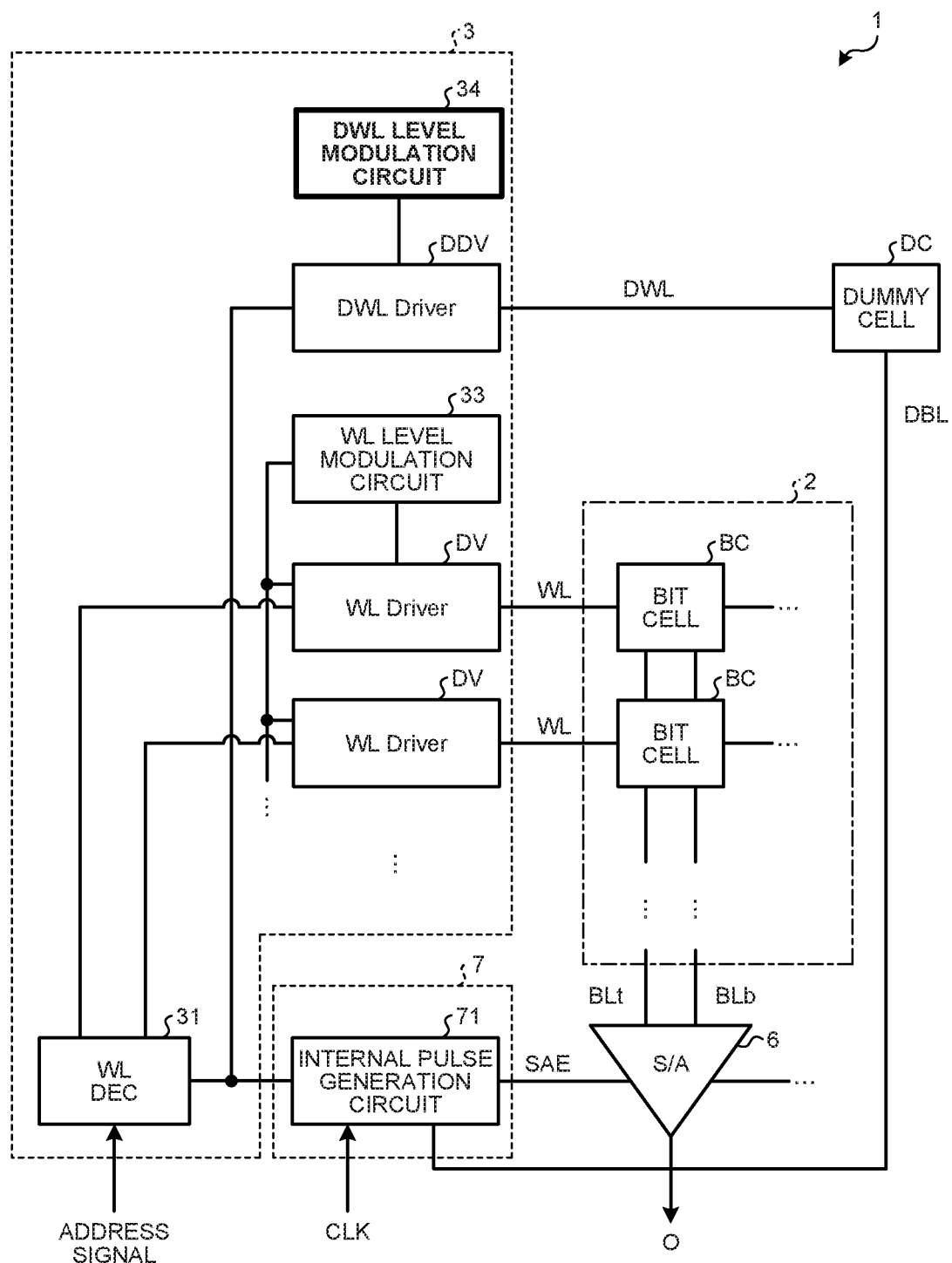
FIG. 1 is a view illustrating a configuration of a semiconductor storage device according to an embodiment.

More specifically, a semiconductor storage device 1 may be configured in a manner illustrated in FIG. 1. FIG. 1 is a view illustrating a configuration of the semiconductor storage device 1. The semiconductor storage device 1 includes a bit cell array 2, a plurality of word lines WL, a plurality of pairs of bit lines BLt and BLb, a row decoder (RDEC) 3, a plurality of sense amplifiers (S/A) 6, a control block 7, a dummy word line DWL, a dummy cell DC, and a dummy bit line DBL.

In FIG. 1, an array of bit cells BC in two rows×one column is illustrated in the bit cell array 2 and a sense amplifier 6 in one column is illustrated for simplification of the drawing. When each of n and m is an arbitrary integer equal to or larger than 2, bit cells BC in n rows×m columns may be arrayed in the bit cell array 2. Also, m sense amplifiers 6 may be provided corresponding to the m columns.

The row decoder 3 includes a word line decoder (WL DEC) 31, a dummy word line driver (DWL Driver) DDV, a plurality of word line drivers (WL Driver) DV, and a word line level modulation circuit (WL level modulation circuit) 33. The control block 7 includes the internal pulse generation circuit 71. The word line decoder 31 has an input node electrically connected to the internal pulse generation circuit 71. The word line decoder 31 has an output node electrically connected to the plurality of word line drivers DV. The internal pulse generation circuit 71 has a first input node electrically connected to the dummy bit line DBL, a second input node which receives a clock CLK, a first output node electrically connected to each of the sense amplifiers 6, and a second output node electrically connected to the word line decoder 31 and the dummy word line driver DDV. The plurality of word line drivers DV is connected to the plurality of bit cells BC through the plurality of word lines WL. The dummy word line driver DDV is electrically connected to the dummy cell DC through the dummy word line DWL.

The word line level modulation circuit 33 is electrically connected to each of the word line drivers DV. The word line level modulation circuit 33 modulates a level of a control signal generated by each of the word line drivers DV. The word line level modulation circuit 33 may control each of the word line drivers DV in such a manner that a level of a word line is changed in stages. The word line level modulation circuit 33 may perform control in such a manner that each of the word line drivers DV performs a read assist operation (described later).

The plurality of word lines WL is extended in a row direction and arrayed in a column direction. Each of the word lines WL is connected to bit cells BC in the same row in common. The dummy word line DWL is extended in the row direction.

Each of the sense amplifiers 6 is connected to a plurality of bit cells BC through a pair of bit lines BLt and BLb. The sense amplifiers 6 perform a sensing operation to detect data in a column selected by a column decoder when receiving a sense amplifier enabling signal SAE in an active level from the internal pulse generation circuit 71. The sense amplifiers 6 may detect data by calculating a difference between potential of the bit line BLt and potential of a bit BLb. The sense amplifiers 6 output, as output data DataOut, data detected by the sensing operation.

The plurality of pairs of bit lines BLt and BLb is extended in the column direction and arrayed in the row direction. Each pair of bit lines BLt and BLb is connected to bit cells BC in the same column in common. The dummy bit line DBL is mainly extended in the column direction.

Figure 2:
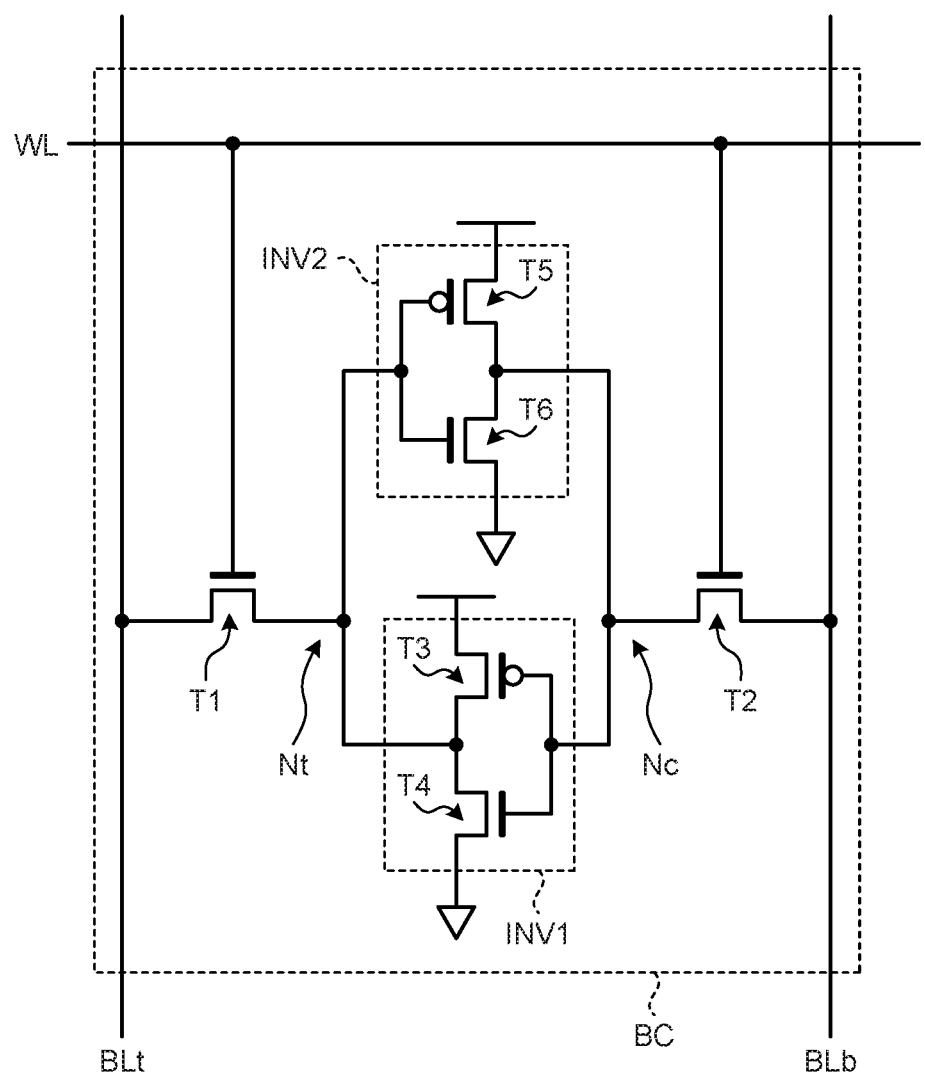
FIG. 2 is a view illustrating a configuration of a bit cell in the embodiment.

Each of the bit cells BC is configured in a manner illustrated in FIG. 2. FIG. 2 is a view illustrating a configuration of a bit cell BC.

The bit cell BC is a six-transistor SRAM cell including load transistors T3 and T5, driving transistors T4 and T6, and transfer transistors T1 and T2. The load transistor T3 and the driving transistor T4 configure an inverter INV1, and the load transistor T5 and the driving transistor T6 configure an inverter INV2. An output terminal of the inverter INV1 is connected to an input terminal of the inverter INV2 through an inversion storage node Nc, and an output terminal of the inverter INV2 is connected to an input terminal of the inverter INV1 through a storage node Nt. The inverter INV1 and the inverter INV2 configure a flip-flop.

The transfer transistor T1 is connected between the storage node Nt of the flip-flop and a bit line BLt. The transfer transistor T2 is connected between the inversion storage node Nc of the flip-flop and an inversion bit line BLb. Each of the transfer transistors T1 and T2 is turned on when a control signal in an active level is supplied from a word line driver 4 to a word line WL. Accordingly, the storage node Nt and the inversion storage node Nc are electrically connected to the bit line BLt and the inversion bit line BLb respectively.

Figure 3:
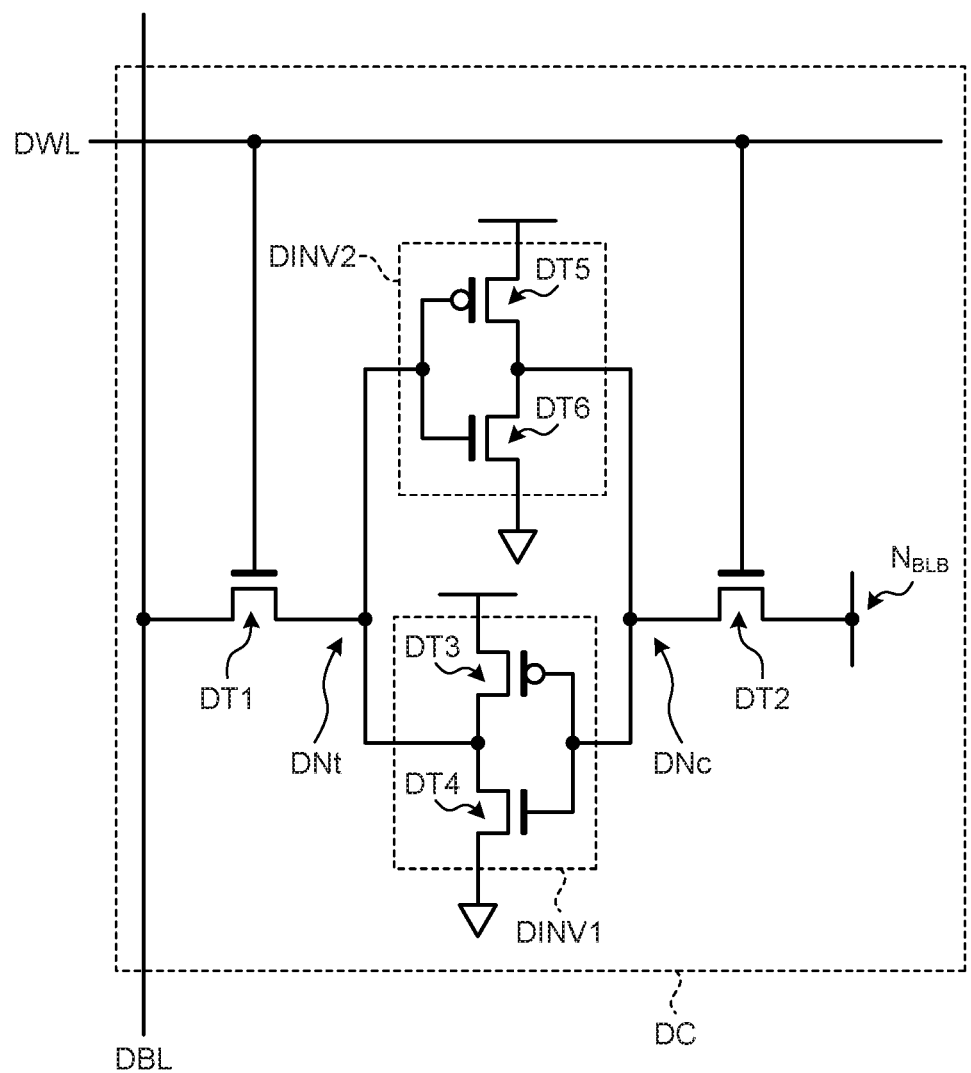
FIG. 3 is a view illustrating a configuration of a dummy cell in the embodiment.

Also, the dummy cell DC is configured in a manner illustrated in FIG. 3. FIG. 3 is a view illustrating a configuration of the dummy cell DC.

The dummy cell DC is a replica of a bit cell BC and has a configuration corresponding to the bit cell BC. The dummy cell DC corresponds to a six-transistor SRAM cell including load transistors DT3 and DT5, driving transistors DT4 and DT6, and transfer transistors DT1 and DT2. The load transistor DT3 and the driving transistor DT4 configure an inverter DINV1, and the load transistor DT5 and the driving transistor DT6 configure an inverter DINV2. An output terminal of the inverter DINV1 is connected to an input terminal of the inverter DINV2 through an inversion storage node DNc, and an output terminal of the inverter DINV2 is connected to an input terminal of the inverter DINV1 through a storage node DNt. The inverter DINV1 and the inverter DINV2 configure a flip-flop.

The transfer transistor DT1 is connected between the storage node DNt of the flip-flop and a dummy bit line DBL. The transfer transistor DT2 is connected between the inversion storage node DNc of the flip-flop and an inversion bit node $N_{BLb}$. Each of the transfer transistors DT1 and DT2 is turned on when a control signal in an active level is supplied from a word line driver 4 to a word line WL. Accordingly, the storage node DNt and the inversion storage node DNc are electrically connected to the dummy bit line DBL and the inversion bit node $N_{BLb}$ respectively. Note that the inversion bit node $N_{BLb}$ corresponds to an inversion bit line BLb connected to bit cells BC, and may be in a floating state.

For example, a case where an L level is held in the storage node Nt and an H level is held in the inversion storage node Nc in a bit cell BC is exemplified. In a read operation, data held in the storage nodes Nt and Nc is transferred to the bit line BLt and the inversion bit line BLb when the transfer transistors T1 and T2 are turned on. Accordingly, data held in the bit cell BC is read to a column decoder (not illustrated) through the bit line BLt and the inversion bit line BLb.

Here, when a voltage of power potential to the bit cell BC becomes low, a voltage of potential of a determination level for the H level and the L level also becomes low. Accordingly, there is a possibility that potential of the storage node Nt and/or the inversion storage node Nc is logically inverted by a charge that may be moved from the bit line BLt and the inversion bit line BLb to the storage node Nt and the inversion storage node Nc by turning on of the transfer transistors T1 and T2. That is, there is a possibility that data held in the storage node Nt and/or the inversion storage node Nc is destroyed.

Figure 4:
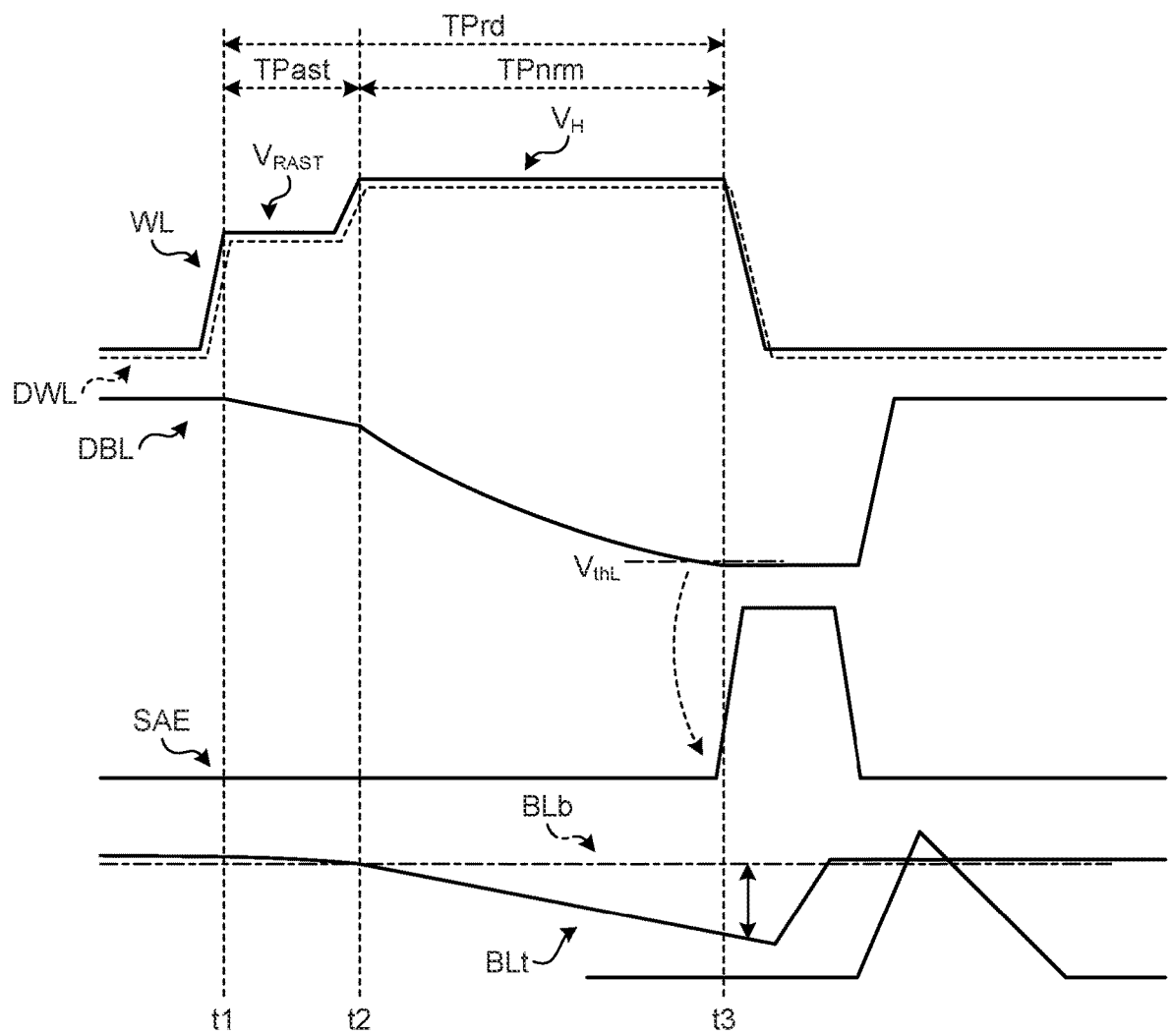
FIG. 4 is a waveform diagram illustrating an operation of the semiconductor storage device according to the embodiment.

On the other hand, as indicated by a solid waveform in FIG. 4, a word line driver DV performs a read assist operation by control of the word line level modulation circuit 33 in a period TPast during a read operation period TPrd. The read assist operation is an operation to control destruction of data held in the bit cell BC, and includes an operation of decreasing a driving capacity of the transfer transistors T1 and T2. FIG. 4 is a waveform diagram illustrating an operation of the semiconductor storage device 1.

At timing t1, the word line driver DV controls a level of a control signal supplied to a word line WL into a read assist level $V_{RAST}$ (such as 1.0 V) lower than a high level $V_H$ (such as 1.2 V). The word line driver DV keeps the level of the control signal supplied to the word line WL in the read assist level $V_{RAST}$ in the period TPast. Accordingly, since a gate voltage of the transfer transistors T1 and T2 is controlled to be low, the driving capacity of the transfer transistors T1 and T2 is decreased. Accordingly, since a movement of a charge from the bit line BLt and the inversion bit line BLb to the storage node Nt and the inversion storage node Nc is controlled, potential of the storage node Nt and/or the inversion storage node Nc becomes less likely to be logically inverted. That is, destruction of the data held in the storage node Nt and/or the inversion storage node Nc can be controlled.

At timing t2 at which potential of the bit line BLt is decreased for a certain degree, the potential of the storage node Nt and the inversion storage node Nc is less likely to be logically inverted. Thus, the word line driver DV controls a level of the control signal supplied to the word line WL into the high level $V_H$. The word line driver DV keeps the level of the control signal, which is supplied to the word line WL, in the high level $V_H$ in a period TPnrm during the read operation period TPrd. Accordingly, the data held in the storage node Nt and the inversion storage node Nc is read to the bit line BLt and the inversion bit line BLb, and the potential of the bit line BLt is decreased to the L level while the inversion bit line BLb is kept in the H level.

Here, timing of a sensing operation with respect to the bit cell BC is controlled by utilization of a cell current in the dummy cell DC.

For example, it is considered that the dummy word line driver DDV supplies a control signal in the high level $V_H$ to the dummy word line at the timing t1 and keeps the dummy word line in the high level $V_H$ during the read operation period TPrd. In this case, since a driving capacity of the transfer transistors DT1 and DT2 in the dummy cell DC is not decreased, potential of a dummy bit DBL is more quickly decreased to the L level than the potential of the bit line BLt. Thus, when a sense amplifier enabling signal SAE is generated in the internal pulse generation circuit 71 by utilization of potential corresponding to the cell current in the dummy bit DBL as it is, the sense amplifier enabling signal SAE rises to an active level (such as H level) before a difference between the potential of the bit line BLt and the potential of the inversion bit line BLb is secured to a level appropriate for detection by a sense amplifier 6. Accordingly, when the sense amplifier 6 performs the sensing operation according to the sense amplifier enabling signal SAE from the internal pulse generation circuit 71, it becomes difficult for the sense amplifier 6 to appropriately detect data (erroneously detect data "1" as data "0," for example).

On the other hand, it is considered to electrically connect, between the dummy bit line DBL and the internal pulse generation circuit 71, a logic delay circuit in which a delay amount thereof is previously set by the number of stages of a delay element. In this case, since variation characteristics due to a variation in a circuit element in a production process and a variation in an operation environment such as voltage or temperature are different between the bit cell BC and the logic delay circuit, an excessive margin with which an operation can be performed in the worst condition in a variation characteristic is secured.

That is, an excessive delay amount corresponding to an excessive margin may be previously set in the logic delay circuit. Accordingly, there is a possibility that the read operation period TPrd from a start to an end of a read operation in the semiconductor storage device 1 becomes long and it becomes difficult to increase a speed of an operation of the semiconductor storage device 1.

Also, when the sensing operation by the sense amplifier 6 is performed at excessively-delayed timing, a difference between the potential of the bit line BLt and the potential of the inversion bit line BLb becomes large and exceeds an appropriate level and power is wastefully consumed in the sense amplifier 6.

Also, there is a case where many delay elements are mounted in the logic delay circuit in order to secure a range in which a delay amount can be set, and there is a possibility that a circuit area of the semiconductor storage device 1 is increased.

Thus, in the present embodiment, it is tried to make timing of a sensing operation during modulation of a level of a word line WL appropriate by modulating a level of a dummy word line DWL in association with the level of the word line WL during the modulation of the level of the word line WL in the semiconductor storage device 1.

More specifically, the row decoder 3 further includes a dummy word line level modulation circuit (DWL level modulation circuit) 34 in the semiconductor storage device 1. The dummy word line level modulation circuit 34 is electrically connected to the dummy word line driver DDV. The dummy word line level modulation circuit 34 controls the dummy word line driver DDV in such a manner that the dummy word line DWL is changed in a change pattern corresponding to a change pattern of a level of the word line WL by the word line level modulation circuit 33. The dummy word line level modulation circuit 34 may control the dummy word line driver DDV in such a manner that a level of the dummy word line DWL is changed in stages. The dummy word line level modulation circuit 34 may perform control in such a manner that the dummy word line driver DDV performs an operation similar to the read assist operation.

As indicated by a dotted line waveform in FIG. 4, the dummy word line driver DDV performs an operation similar to the read assist operation by control by the dummy word line level modulation circuit 34 in the period TPast during the read operation period TPrd.

At the timing t1, the dummy word line driver DDV controls a level of a control signal supplied to the dummy word line DWL into a read assist level $V_{RAST}$ (such as 1.0 V) lower than a high level $V_H$ (such as 1.2 V). The dummy word line driver DDV keeps the level of the control signal supplied to the dummy word line DWL to the read assist level $V_{RAST}$ in the period TPast. Accordingly, a driving capacity of the transfer transistors DT1 and DT2 in the dummy cell DC is decreased, and potential of the dummy bit line DBL is moderately decreased similarly to the potential of the bit line BLt.

At the timing t2 at which the potential of the bit line BLt is decreased for a certain degree, the dummy word line driver DDV controls the level of the control signal supplied to the dummy word line DWL into a high level $V_H$. The dummy word line driver DDV keeps the level of the control signal supplied to the dummy word line DWL in the high level $V_H$ in the period TPnrm during the read operation period TPrd. Accordingly, the potential of the dummy bit line DBL is decreased in a slightly sharp inclination similar to that of the potential of the bit line BLt.

Immediately before the timing t3 at which the bit line BLt and the dummy bit line DBL are decreased to the L level substantially at the same time, the internal pulse generation circuit 71 raises the sense amplifier enabling signal SAE from a non-active level (such as L level) to an active level (such as H level). For example, the internal pulse generation circuit 71 has a determination threshold $V_{thL}$ for the L level, and compares the potential of the dummy bit line DBL and the determination threshold $V_{thL}$ with a comparator or the like. The internal pulse generation circuit 71 raises the sense amplifier enabling signal SAE to the active level in response to the potential of the dummy bit line DBL being lower than the determination threshold $V_{thL}$. The internal pulse generation circuit 71 supplies the sense amplifier enabling signal SAE to the sense amplifier 6.

At the timing t3, the sense amplifier 6 performs the sensing operation according to the sense amplifier enabling signal SAE in the active level. Accordingly, at appropriate timing, the sense amplifier 6 can detect a difference between the potential of the bit line BLt and the potential of the inversion bit line BLb that are secured to an appropriate level.

As illustrated in FIG. 4, it is possible to associate an operation of the dummy cell DC with an operation of the bit cell BC by associating a change pattern of the dummy word line DWL with a change pattern of the word line WL, and it is possible to make a potential change of the dummy bit line DBL follow a potential change of the bit line BLt in an analog manner in response thereto. That is, since variation characteristics due to a variation in a circuit element in a production process and a variation in an operation environment such as voltage or temperature are similar between the bit cell BC and the dummy cell DC, it is possible to greatly reduce a timing margin to be secured. Accordingly, it is possible to reduce the read operation period TPrd from a start to an end of the read operation in the semiconductor storage device 1 and to easily increase a speed of an operation of the semiconductor storage device 1.

Also, since it is possible to perform the sensing operation by the sense amplifier 6 at appropriate timing, it is possible to perform the sensing operation with a difference between the potential of the bit line BLt and the potential of the inversion bit line BLb being an appropriate level and to reduce power consumption of the sense amplifier 6.

Also, it is possible to control an increase in a circuit area of the semiconductor storage device 1 since it is not necessary to provide a logic delay circuit between the dummy bit line DBL and the internal pulse generation circuit 71.

As described above, a level of the dummy word line DWL is modulated in association with a level of the word line WL during modulation of the level of the word line WL in the semiconductor storage device 1. Accordingly, it is possible to make timing of the sensing operation in the modulation of the level of the word line WL appropriate.

Figure 5:
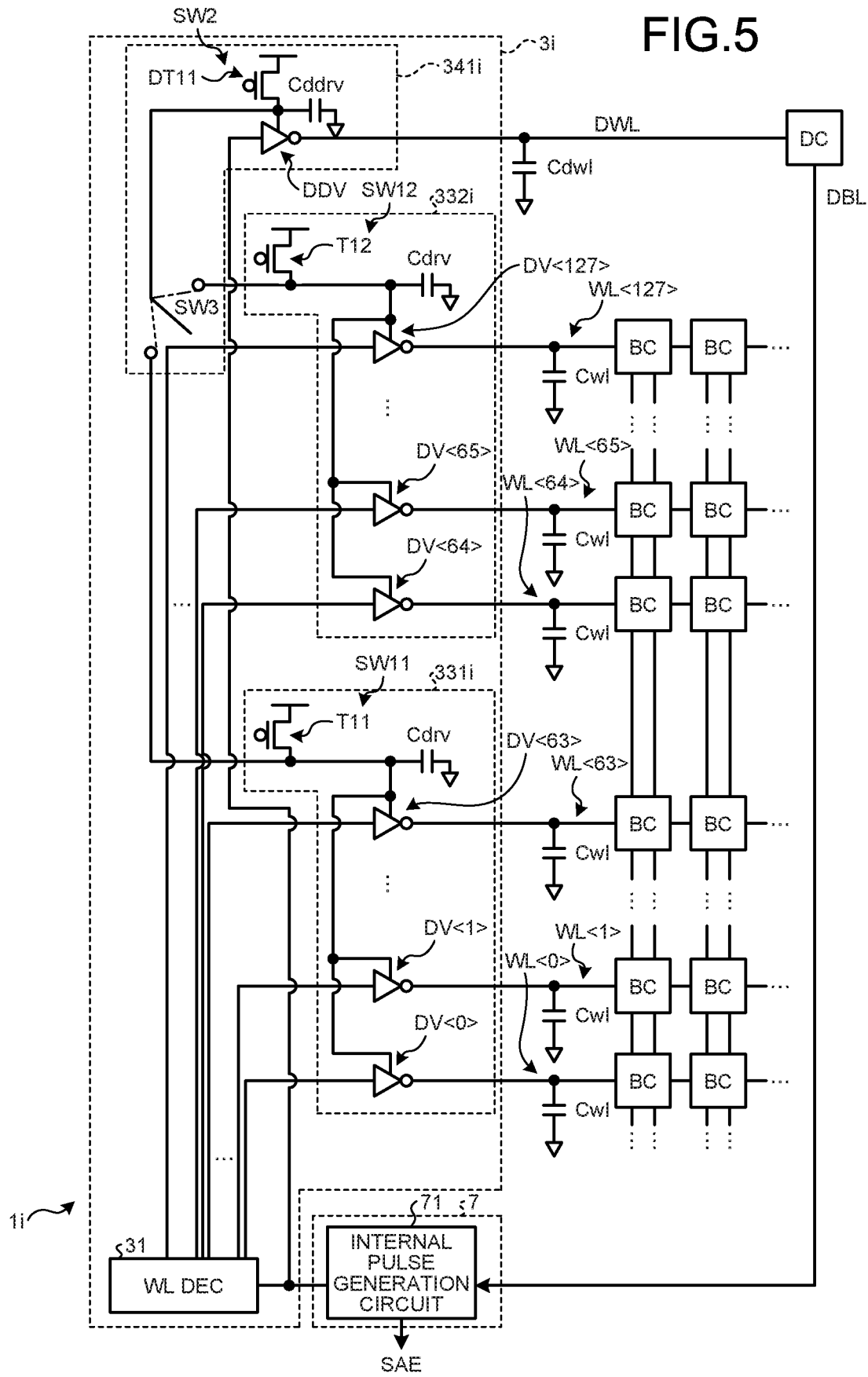
FIG. 5 is a circuit diagram illustrating a configuration of a row decoder in a first modification example of the embodiment.

Note that as illustrated in FIG. 5, a plurality of word line drivers DV, a dummy word line driver DVV, a word line level modulation circuit 33, and a dummy word line level modulation circuit 34 in a row decoder 3$i$ of a semiconductor storage device 1$i$ may be configured by a charge sharing circuit. FIG. 5 is a circuit diagram illustrating a configuration of the row decoder 3$i$ in a first modification example of the embodiment. Although a case where 128 word lines WL are provided is exemplified in FIG. 5, the number of the word lines WL may be smaller than 128 or may be larger than 128.

The row decoder 3$i$ includes a dummy driver block 341$i$, a driver block 331$i$, and a driver block 332$i$.

The driver block 331$i$ includes a switch SW11 and a plurality of word line drivers DV<0> to DV<63>. The switch SW11 connects a power node of each of the word line drivers DV<0> to DV<63> to power potential. A common power node to which the power nodes of the plurality of word line drivers DV<0> to DV<63> are connected in common has capacitance Cdrv as parasitic capacitance. Accordingly, a charge corresponding to power potential may be accumulated in the capacitance Cdrv of the common power node. The switch SW11 includes a PMOS transistor T11. In the PMOS transistor T11, a source is electrically connected to the power potential, a gate is electrically connected to a word line decoder 31, and a drain is electrically connected to the common power node of the word line drivers DV<0> to DV<63>. An input node of each of the word line drivers DV<0> to DV<63> is electrically connected to the word line decoder 31.

The driver block 332$i$ includes a switch SW12 and a plurality of word line drivers DV<64> to DV<127>. The switch SW12 connects a power node of each of the word line drivers DV<64> to DV<127> to power potential. A common power node to which the power nodes of the plurality of word line drivers DV<64> to DV<127> are connected in common has capacitance Cdrv as parasitic capacitance. Accordingly, a charge corresponding to power potential may be accumulated in the capacitance Cdrv of the common power node. The switch SW12 includes a PMOS transistor T12. In the PMOS transistor T12, a source is electrically connected to the power potential, a gate is electrically connected to the word line decoder 31, a drain is electrically connected to the common power node of the word line drivers DV<64> to DV<127>. An input node of each of the word line drivers DV<64> to DV<127> is electrically connected to the word line decoder 31.

A dummy driver block 341$i$ includes a switch SW2, a switch SW3, and a dummy word line driver DDV. The switch SW2 connects a power node of the dummy word line driver DDV to the power potential. The power node of the dummy word line driver DDV has capacitance Cddrv as parasitic capacitance. Accordingly, a charge corresponding to the power potential may be accumulated in the capacitance Cddrv of the power node. The switch SW2 includes a PMOS transistor DT11. In the PMOS transistor DT11, a source is electrically connected to the power potential, a gate is electrically connected to the word line decoder 31, and a drain is electrically connected to the power node of the dummy word line driver DDV. An input node of the dummy word line driver DDV is electrically connected to the word line decoder 31.

The switch SW3 selects and connects a driver block that is not used for driving of a word line between the driver block 331$i$ and the driver block 332$i$.

For example, in a case where the driver block 331$i$ is used for driving of a word line, the switch SW3 is switched to a state indicated by a dashed-dotted line, and the power node of the dummy word line driver DDV in the dummy driver block 341$i$ is electrically connected to the common power node of the driver block 331$i$. Accordingly, it is possible to share a charge between the dummy driver block 341$i$ and the driver block 332$i$.

Here, a configuration including the switch SW2, the switch SW3, and the switch SW12 functions as a dummy word line level modulation circuit 34 in the dummy driver block 341$i$ and the driver block 332$i$. That is, a charge is redistributed according to a ratio between combined capacitance of the capacitance Cddrv and the capacitance Cdrv and combined capacitance of capacitance Cwl of the word lines WL<64> to WL<127>, and potential of the word lines WL is controlled to a read assist level $V_{RAST}$ (such 1.0 V) lower than a high level $V_H$ (such as 1.2 V). Also, a charge is redistributed according a ratio between the capacitance Cdrv and the combined capacitance of the capacitance Cwl of the word lines WL<0> to WL<63>, and potential of the word lines WL is controlled to the read assist level $V_{RAST}$ (such as 1.0 V) lower than the high level $V_H$ (such as 1.2 V) in the driver block 331$i$.

Figure 6:
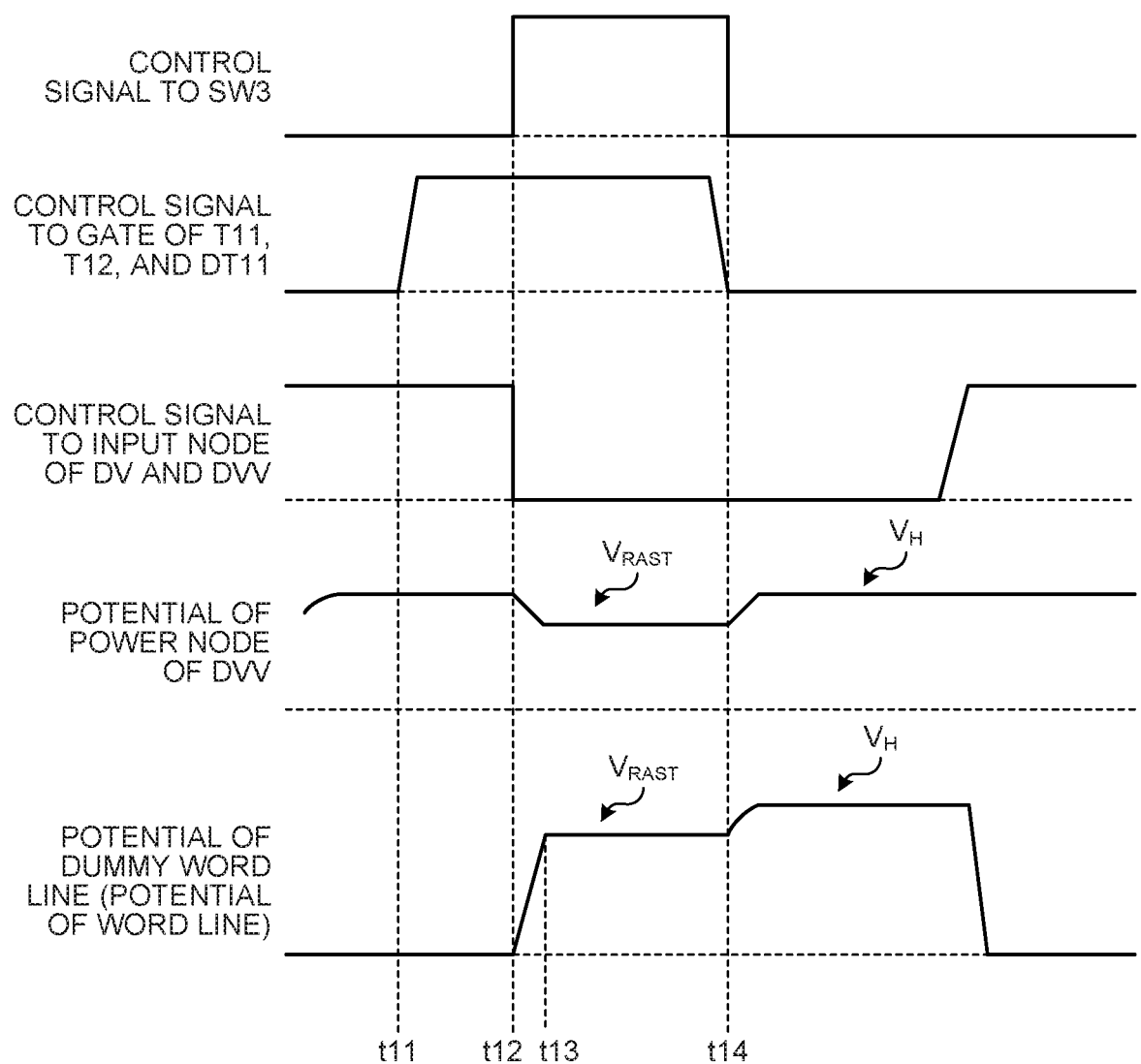
FIG. 6 is a waveform diagram illustrating an operation of the row decoder in the first modification example of the embodiment.

More specifically, as illustrated in FIG. 6, the transistors T12 and DT11 are kept in an on state and a charge may be accumulated in each of the capacitance Cddrv and the capacitance Cdrv in a period before timing t11.

The transistors T12 and DT11 are turned off at the timing t11.

A control signal in an L level is supplied to the dummy word line driver DDV in the dummy driver block 341$i$ and a word line driver DV corresponding to a selected word line in the driver block 331$i$ at timing t12. Also, the switch SW3 in the dummy driver block 341$i$ is turned on (for example, into state indicated by dashed-dotted line in FIG. 5).

At the timing t13, a charge sharing operation of redistributing a charge according to a ratio between the combined capacitance of the capacitance Cddrv and the capacitance Cdrv and the combined capacitance of the capacitance Cwl of the word lines WL<64> to WL<127> is performed in the dummy driver block 341$i$ and the driver block 332$i$. Accordingly, the common power node of the word line drivers DV and the power node of the dummy word line driver DDV, for example, become the read assist level $V_{PAST}$ that is lower than the high level $V_H$ for a predetermined level. Accordingly, the dummy word line driver DDV performs an operation similar to the read assist operation, for example, in the period TPast (see FIG. 4). Also, a charge sharing operation of redistributing a charge according to a ratio between the capacitance Cdrv and the combined capacitance of the capacitance Cwl of the word lines WL<0> to WL<63> is performed in the driver block 331i. Accordingly, the common power node of the word line drivers DV, for example, becomes the read assist level $V_{RAST}$ lower than the high level $V_H$ for a predetermined level. Accordingly, the word line drivers DV perform the read assist operation, for example, in the period TPast (see FIG. 4).

The switch SW3 is turned off and the transistors T12 and DT11 are turned on at timing t14.

In a period after the timing t14, the transistors T12 and DT11 are kept in the on state and the common power node of the word line drivers DV and the power node of the dummy word line driver DDV, for example, become the high level $V_H$.

Referring back to FIG. 5, for example, in a case where the driver block 332i is used for driving of a word line, the switch SW3 is switched to a state indicated by a dotted line, and the power node of the dummy word line driver DDV in the dummy driver block 341i is electrically connected to the common power node of the driver block 332i. Accordingly, it is possible to share a charge between the dummy driver block 341i and the driver block 331i.

Here, a configuration including the switch SW2, the switch SW3, and the switch SW11 functions as the dummy word line level modulation circuit 34 in the dummy driver block 341i and the driver block 331i. That is, a charge is redistributed according to a ratio between combined capacitance of the capacitance Cddrv and the capacitance Cdrv and combined capacitance of capacitance Cwl of the word lines WL<0> to WL<63>, and potential of the word lines WL is controlled to a read assist level $V_{RAST}$ (such 1.0 V) lower than a high level $V_H$ (such as 1.2 V). Also, a charge is redistributed according a ratio between the capacitance Cdrv and combined capacitance of the capacitance Cwl of the word lines WL<64> to WL<127>, and potential of the word lines WL is controlled to the read assist level $V_{RAST}$ (such as 1.0 V) lower than the high level $V_H$ (such as 1.2 V) in the driver block 332i.

In such a manner, the dummy word line level modulation circuit 34 (see FIG. 1) is configured in such a manner as to share different parts of a configuration of the word line level modulation circuit 33 in a time division manner according to connection switching by the switch SW3. Accordingly, it is possible to easily reduce a circuit area of the row decoder 3i.

Figure 7:
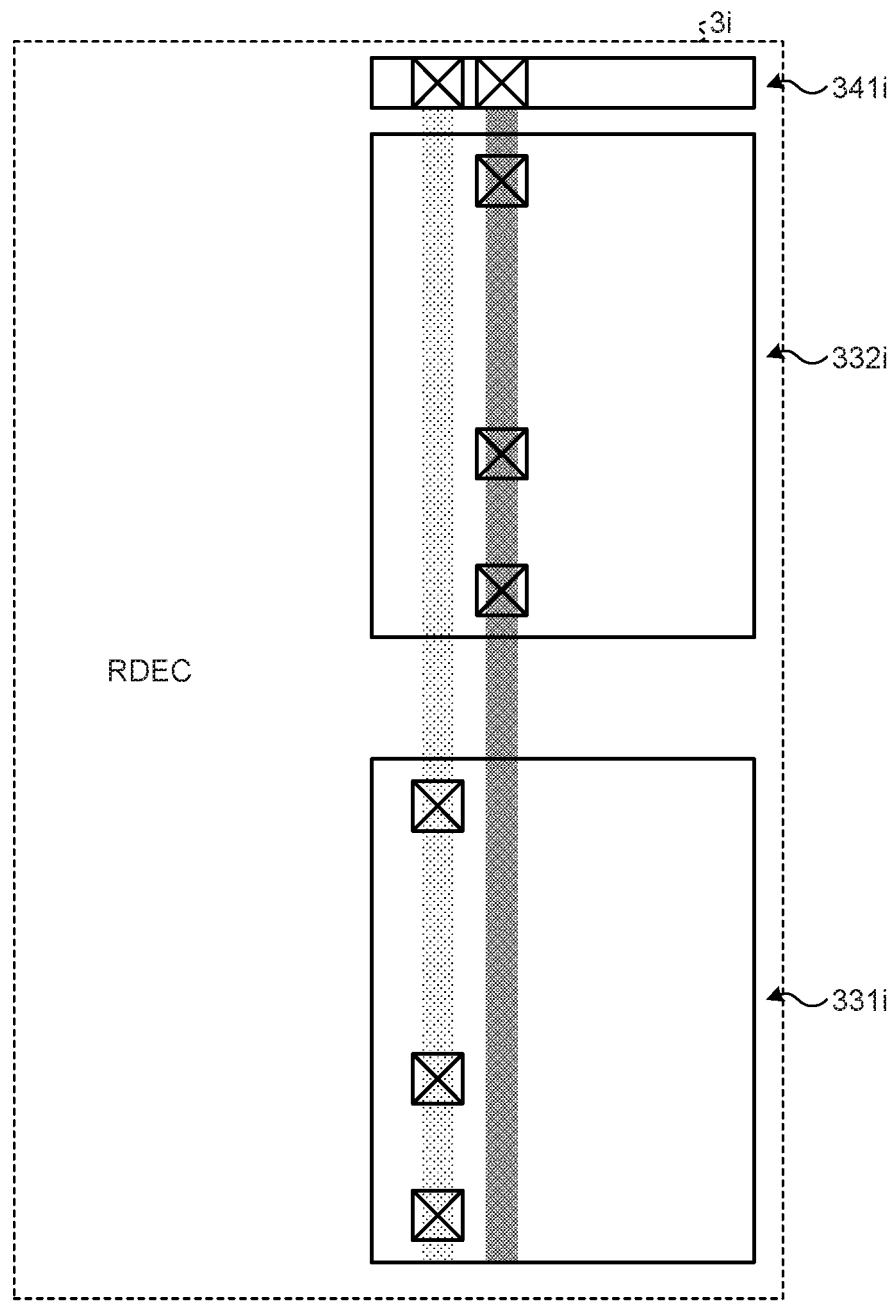
FIG. 7 is a plan view illustrating a mount form of the row decoder in the first modification example of the embodiment.

Also, in this case, the dummy driver block 341i, the driver block 331i, and the driver block 332i in the row decoder 3i may be arranged in proximity to each other in an arrangement region of the row decoder 3i, as illustrated in FIG. 7. FIG. 7 is a plan view illustrating a mount form of the row decoder 3i in the first modification example of the embodiment. Accordingly, it is possible to easily reduce a layout area of the row decoder 3i.

Figure 8:
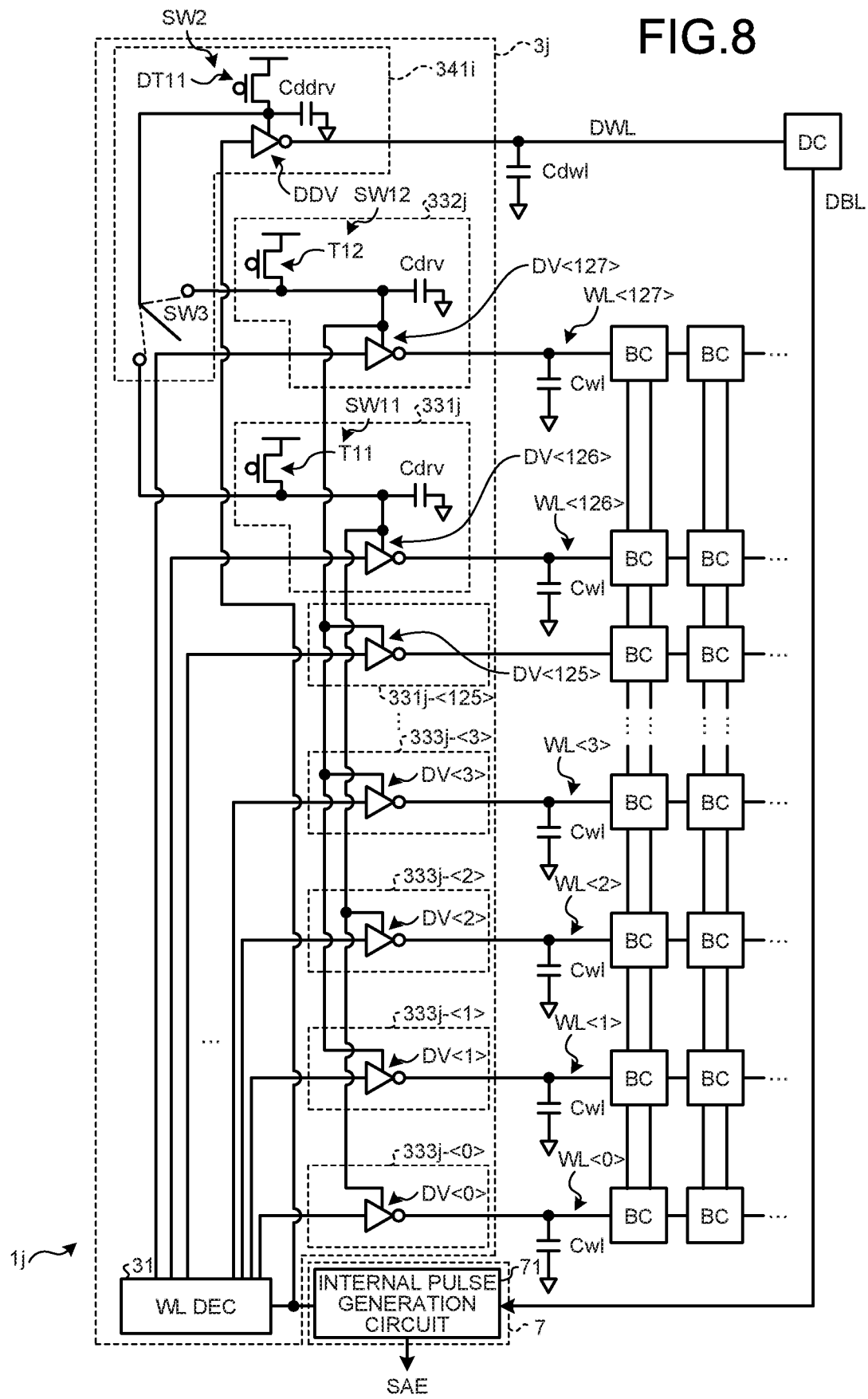
FIG. 8 is a circuit diagram illustrating a configuration of a row decoder in a second modification example of the embodiment.

Alternatively, a plurality of word line drivers DV, a dummy word line driver DVV, a word line level modulation circuit 33, and a dummy word line level modulation circuit 34 in a row decoder 3j of a semiconductor storage device 1j may be configured by a charge sharing circuit in a manner illustrated in FIG. 8. FIG. 8 is a circuit diagram illustrating a configuration of the row decoder 3j in a second modification example of the embodiment. The row decoder 3j includes a dummy driver block 341i, a driver block 331j, a driver block 332j, and a plurality of driver blocks 333j-<0> to 333j-<125>. The driver block 331j is acquired by replacement of the plurality of word line drivers DV<0> to DV<63> in the driver block 331i illustrated in FIG. 5 with a word line driver DV<127>. An input node of the word line driver DV<127> is electrically connected to a word line decoder 31. The driver block 332j is acquired by replacement of the plurality of word line drivers DV<64> to DV<127> in the driver block 332i illustrated in FIG. 5 with a word line driver DV<126>. An input node of the word line driver DV<126> is electrically connected to the word line decoder 31.

The driver blocks 333j-<0> to 333j-<125> respectively include word line drivers DV<0> to DV<125>. An input node of each of the word line drivers DV<0> to DV<125> is electrically connected to the word line decoder 31.

A power node of a word line driver DV in each of even-numbered driver blocks 333j in the driver blocks 333j-<0> to 333j-<125> is electrically connected to a common power node in a driver block 331i. Accordingly, a circuit configuration similar to that of the driver block 331i illustrated in FIG. 5 may be realized.

A power node of a word line driver DV in each of odd-numbered driver blocks 333j in the driver blocks 333j-<0> to 333j-<125> is electrically connected to a common power node in a driver block 332i. Accordingly, a circuit configuration similar to that of the driver block 332i illustrated in FIG. 5 may be realized.

Figure 9:
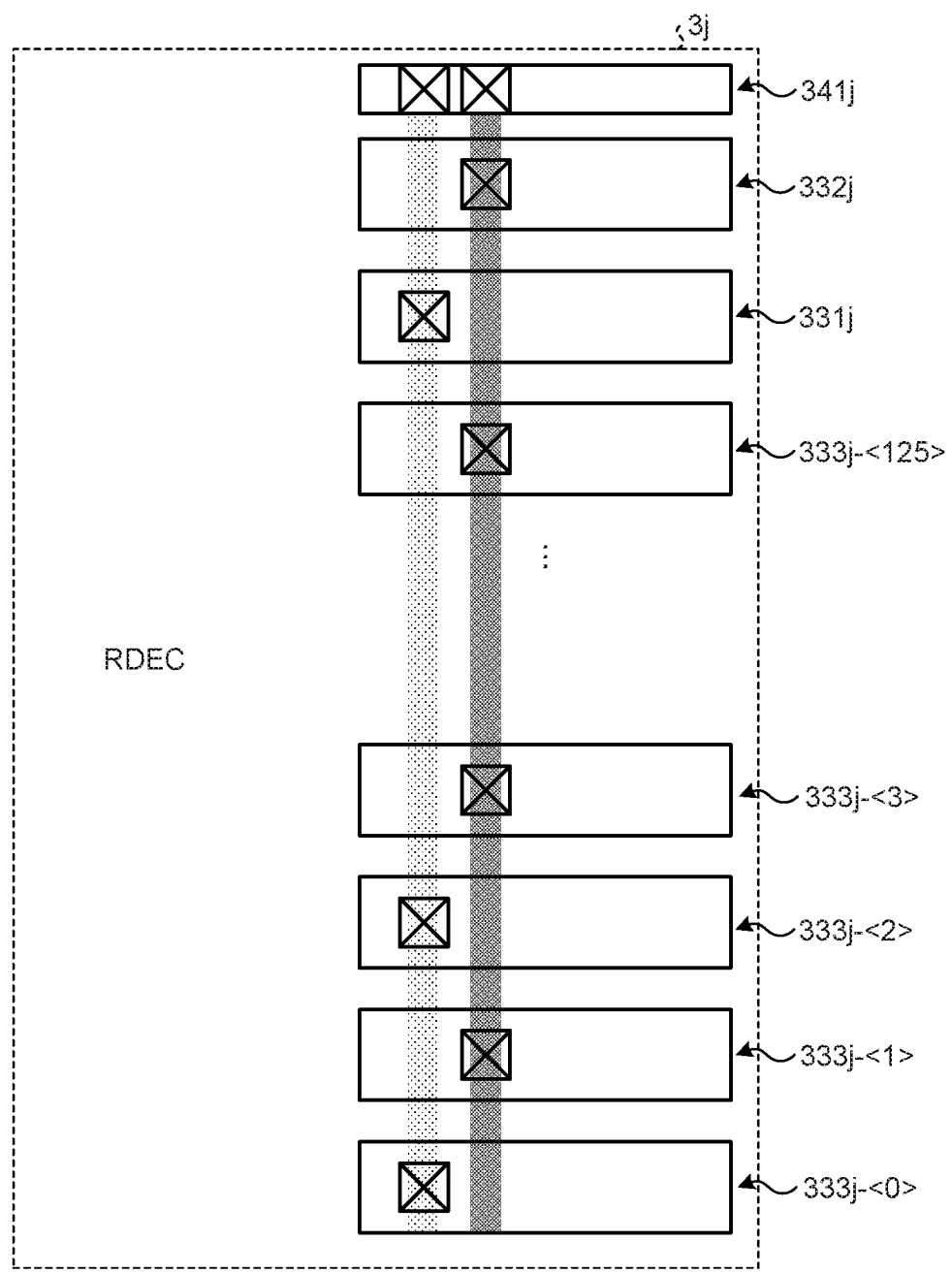
FIG. 9 is a plan view illustrating a mount form of the row decoder in the second modification example of the embodiment.

Also, in this case, the dummy driver block 341i, the driver block 331j, the driver block 332j, and the plurality of driver blocks 333j-<0> to 333j-<125> in the row decoder 3j may be arranged in proximity to each other in an arrangement region of the row decoder 3j, as illustrated in FIG. 9. FIG. 9 is a plan view illustrating a mount form of the row decoder 3j in the second modification example of the embodiment. That is, in the configuration illustrated in FIG. 9, it is possible to consider that a circuit configuration similar to that of the driver block 331i and a circuit configuration similar to that of the driver block 332i are alternately arranged divisionally. Accordingly, in the circuit configuration similar to that of the driver block 331i and the circuit configuration similar to that of the driver block 332i, it is possible to uniform wiring line lengths from the word line decoder 31 and to equalize circuit characteristics such as a transmission delay of a wiring line.

Alternatively, as illustrated in FIG. 10A and FIG. 10B, voltage waveforms of a word line WL and a dummy word line DWL which waveforms are respectively modulated in a word line level modulation circuit 33 and a dummy word line level modulation circuit 34 may be voltage waveforms changed in multiple stages. FIG. 10A and FIG. 10B are waveform diagrams illustrating an operation of a semiconductor storage device according to a third modification example of the embodiment.

In FIG. 10A, a level gradually rises from an L level $V_L$ to an H level $V_H$ in a period TP1, is kept in the H level $V_H$ in a period TP2, and is controlled to a write assist level $V_{WAST}$ higher than the H level $V_H$ in a period TP3. Alternatively, in FIG. 10B, a level is controlled to a read assist level $V_{RAST}$ lower than the H level $V_H$ in the period TP1, is kept in the H level $V_H$ in the period TP2, and is controlled to the write assist level $V_{WAST}$ higher than the H level $V_H$ in the period TP3. An idea of the embodiment can be also applied to such a modulation and an effect similar to that of the embodiment can be realized.

Note that the write assist level $V_{WAST}$ is a level in which a write assist operation is performed. The write assist operation is an operation to promote writing of data into a bit cell BC, and includes an operation of increasing a driving capacity of transfer transistors T1, T2, DT1, and DT2. That is, by the write assist operation, it is possible to improve driving capacity of the transfer transistors T1 and T2 by making a level of the word line WL higher and to improve driving capacity of the transfer transistors DT1 and DT2 by making a level of the dummy word line DWL higher. Accordingly, it is possible to promote writing of data into a storage node Nt and an inversion storage node Nc of a bit cell BC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a bit cell;
   a dummy cell;
   a word line electrically connected to the bit cell;
   a dummy word line electrically connected to the dummy cell;
   a word line driver electrically connected to the word line;
   a dummy word line driver electrically connected to the dummy word line;
   a first modulation circuit electrically connected to the word line driver; and
   a second modulation circuit electrically connected to the dummy word line driver,
   wherein the first modulation circuit temporally changes a level of the word line in a first waveform pattern, and
   the second modulation circuit temporally changes a level of the dummy word line in a second waveform pattern corresponding to the first waveform pattern,
   the first modulation circuit makes the level of the word line into a first level in a first period, and makes the level of the word line into a second level higher than the first level in a second period after the first period, and
   the second modulation circuit makes the level of the dummy word line into a third level in the first period, and makes the level of the dummy word line into a fourth level higher than the third level in the second period.

2. The semiconductor storage device according to claim 1, further comprising:
   a bit line electrically connected to the bit cell;
   a dummy bit line electrically connected to the dummy cell;
   a sense amplifier electrically connected to the bit line; and
   a pulse generation circuit an input side of which is electrically connected to the dummy bit line and which receives a clock, and an output side of which is electrically connected to the sense amplifier and to the second modulation circuit.

3. The semiconductor storage device according to claim 1, wherein the first modulation circuit temporally changes the level of the word line in stages, and
   the second modulation circuit temporally changes the level of the dummy word line in stages.

4. The semiconductor integrated circuit according to claim 1,
   wherein the first modulation circuit gradually makes the level of the word line into the first level in the first period, and
   the second modulation circuit gradually makes the level of the dummy word line into the third level in the first period.

5. The semiconductor storage device according to claim 1,
   wherein the first modulation circuit makes the level of the word line into a fifth level higher than the second level in a third period after the second period, and
   the second modulation circuit makes the level of the dummy word line into a sixth level higher than the fourth level in the third period.

6. The semiconductor storage device according to claim 1,
   wherein the third level is a level corresponding to the first level, and
   the fourth level is a level corresponding to the second level.

7. The semiconductor storage device according to claim 5,
   wherein the third level is a level corresponding to the first level,
   the fourth level is a level corresponding to the second level, and
   the sixth level is a level corresponding to the fifth level.

8. The semiconductor storage device according to claim 1,
   wherein the first modulation circuit, the word line driver, the second modulation circuit, and the dummy word line driver are configured with a charge sharing type circuit structure.

9. A semiconductor storage device comprising:
   a bit cell;
   a dummy cell;
   a word line electrically connected to the bit cell;
   a dummy word line electrically connected to the dummy cell;
   a word line driver electrically connected to the word line;
   a dummy word line driver electrically connected to the dummy word line;
   a first modulation circuit electrically connected to the word line driver; and
   a second modulation circuit electrically connected to the dummy word line driver,
   wherein the first modulation circuit includes a power switch that electrically connects a power node of the word line driver to power potential, and
   the second modulation circuit includes
   a dummy power switch that electrically connects a power node of the dummy word line driver to the power potential, and
   a connection switch that electrically connects one end of the dummy power switch to one end of the power switch.

10. The semiconductor storage device according to claim 1,
    wherein the semiconductor storage device includes a plurality of the word lines and a plurality of the word line drivers,
    the plurality of word lines includes a plurality of first word lines and a plurality of second word lines, and
    the plurality of word line drivers includes
    a first word line driver group that is electrically connected to the plurality of first word lines and that shares a power node with each other, and
    a second word line driver group that is electrically connected to the plurality of second word lines and that shares a power node with each other.

11. The semiconductor storage device according to claim 10, wherein the dummy word line driver, the first word line driver group, and the second word line driver group are arranged in proximity to each other.

12. The semiconductor storage device according to claim 10,
wherein the first word line driver group and the second word line driver group are alternately arranged divisionally.

13. The semiconductor storage device according to claim 10,
wherein the second modulation circuit includes a connection switch that can switch a first state in which the dummy word line driver is electrically connected to the first word line driver group and a second state in which the dummy word line driver is electrically connected to the second word line driver group.

14. The semiconductor storage device according to claim 13,
wherein the connection switch performs switching to the first state in a case where driving of the first word lines is performed, and performs switching to the second state in a case where driving of the second word lines is performed.

15. The semiconductor storage device according to claim 13,
wherein the first modulation circuit further includes
a first power switch that electrically connects the power node of the first word line driver group to power potential, and a second power switch that electrically connects the power node of the second word line driver group to the power potential,
the second modulation circuit further includes
a dummy power switch that electrically connects a power node of the dummy word line driver to the power potential, and
wherein the connection switch electrically connects one end of the dummy power switch to one end of the first power switch in the first state, and electrically connects one end of the dummy power switch to one end of the second power switch in the second state.

16. The semiconductor storage device according to claim 15,
wherein the dummy word line driver, the first word line driver group, and the second word line driver group are arranged in proximity to each other.

17. The semiconductor storage device according to claim 15,
wherein the first word line driver group and the second word line driver group are alternately arranged divisionally.

18. The semiconductor storage device according to claim 17, further comprising
a word line decoder electrically connected to an input node of each of the plurality of word line drivers.

* * * * *